(12) United States Patent
Goto et al.

(10) Patent No.: US 9,059,221 B2
(45) Date of Patent: Jun. 16, 2015

(54) SUBSTRATE PROCESSING METHOD AND SUBSTRATE PROCESSING APPARATUS

(75) Inventors: Tomohiro Goto, Kyoto (JP); Masakazu Sanada, Kyoto (JP); Kazuhito Shigemori, Kyoto (JP); Osamu Tamada, Kyoto (JP); Shuichi Yasuda, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 827 days.

(21) Appl. No.: 11/846,890

(22) Filed: Aug. 29, 2007

(65) Prior Publication Data

US 2008/0053487 A1 Mar. 6, 2008

(30) Foreign Application Priority Data

Aug. 29, 2006 (JP) .................................. 2006-231565
Aug. 29, 2006 (JP) .................................. 2006-231566

(51) Int. Cl.
| | |
|---|---|
| H01L 21/02 | (2006.01) |
| B08B 3/04 | (2006.01) |
| F26B 5/08 | (2006.01) |
| H01L 21/67 | (2006.01) |

(52) U.S. Cl.
CPC ............ *H01L 21/67028* (2013.01); *F26B 5/08* (2013.01); *H01L 21/67034* (2013.01); *H01L 21/02057* (2013.01); *H01L 21/67051* (2013.01)

(58) Field of Classification Search
CPC ............................. H01L 21/67034; F26B 5/08
USPC ................................................. 134/30, 33, 37
See application file for complete search history.

(56) References Cited

U.S. PATENT DOCUMENTS

| | | | | |
|---|---|---|---|---|
| 2003/0079764 A1* | 5/2003 | Hirose et al. | ................. | 134/95.3 |
| 2006/0048792 A1* | 3/2006 | Nakamura et al. | ................. | 134/2 |

FOREIGN PATENT DOCUMENTS

| | | |
|---|---|---|
| JP | 10-335298 | 12/1998 |
| JP | 3694641 | 7/2005 |
| JP | 2005-340248 | 12/2005 |
| JP | 2006-66579 | 3/2006 |
| JP | 2006-80315 | 3/2006 |

OTHER PUBLICATIONS

Office Action issued Apr. 12, 2011 in connection with corresponding Japanese Patent Application No. JP2006-231565 (JP2006-80315 was previously filed in an IDS submitted Jan. 29, 2009 and is therefore not enclosed.).

* cited by examiner

*Primary Examiner* — Michael Kornakov
*Assistant Examiner* — Natasha Campbell
(74) *Attorney, Agent, or Firm* — Ostrolenk Faber LLP (57) ABSTRACT

A method capable of eliminating occurrence of a development failure when a DI water discharge nozzle 20 is scanned to dry a substrate by spinning is provided. A substrate W is held in a horizontal posture by a spin chuck 10 and rotated about a vertical axis by a rotation motor 14, and when an outlet of the nozzle 20 is scanned from a position opposed to a center of the substrate W to a position opposed to a circumferential edge while a cleaning solution being discharged, immediately after the nozzle 20 has started to move, only one dried core is produced in the vicinity of the center of the substrate W, and thus production of not less than two dried cores in the vicinity of the center of the substrate W is prevented. The dried region is spread all over the surface of the substrate W.

8 Claims, 5 Drawing Sheets

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus in which a substrate such as semiconductor wafer, liquid crystal display glass substrate, photo-mask glass substrate, optical disk substrate is rotated about a vertical axis in a horizontal plane, and the substrate is dried while feeding a cleaning solution such as de-ionized water onto the surface of the substrate.

2. Description of the Related Art

In a conventional process of manufacturing a semiconductor device, a circuit pattern is formed on a resist film of a substrate employing a lithography, for example, by the steps of applying a photo-resist on a silicone substrate, printing a circuit pattern onto a resist film on the substrate using an exposure device, and developing the resist film having been exposed with a developer. In the developing among these steps, the developer is fed onto the resist film having been exposed and formed on the surface of the substrate, for example, with the use of a slit nozzle, and thereafter, while the substrate is being rotated about the vertical axis in a horizontal plane, a cleaning solution (rinse) such as DI water is discharged on the center of the substrate from an outlet of the straight nozzle. The cleaning solution having been fed on the center of the substrate diffuses toward a circumferential edge of the substrate by a centrifugal force to spread all over the substrate, and washes out the developer from the resist film on the substrate surface. When this cleaning (rinsing) is ended, the feed of a cleaning solution from the nozzle onto the substrate is stopped, thereafter the number of revolutions of the substrate is further increased, and thus the cleaning solution on the resist film on the substrate surface is shaken off by the centrifugal force, whereby the substrate is dried (by spinning).

When the substrate is dried by spinning as mentioned above, however, a droplet of the cleaning solution may remain forming a spot on the substrate occurs. This is because, on the substrate having been processed, hydrophilic portions and hydrophobic portions coexist on the surface of the resist film, thereby leading to fluctuations in retention of the cleaning solution on the substrate. It is known that the droplet of the cleaning solution having remained as a spot on the resist pattern of the surface of the substrate like this is a factor of causing a development failure.

To overcome the above-mentioned problems, a method (so-called scan rinsing) has been proposed, and in which in the process of drying a substrate, while a cleaning solution is being discharged from an outlet of a cleaning solution discharge nozzle, the outlet of this discharge nozzle is scanned from the center of the substrate to the periphery thereof. In this method, since the drying goes on keeping a state that droplets of the cleaning solution are formed and held from the center of the substrate to the circumferential edge, the droplet of the cleaning solution is less likely to remain on the substrate, in spite of a resist film surface on which hydrophilic portions and hydrophobic portions are mixed. A further method has been proposed, and in which at the time of scanning a discharge nozzle of the cleaning solution while the cleaning solution is being discharged from the outlet of the discharge nozzle, with a gas blown out from an air jet nozzle, the air jet nozzle is moved from the center of the substrate toward the periphery together or in synchronization with the cleaning solution discharge nozzle (for example, refer to the Japanese Patent No. 3694641)

In the above-mentioned scan rinsing, as compared with a conventional spin drying, the development failure may be largely reduced. In the case, however, where the method of scan rinsing is applied to a substrate including a resist film surface of high water-repellent properties (for example, a contact angle of water is not less than 60°), it is found that the development failure occurs showing the following phenomenon.

Figure 7A:
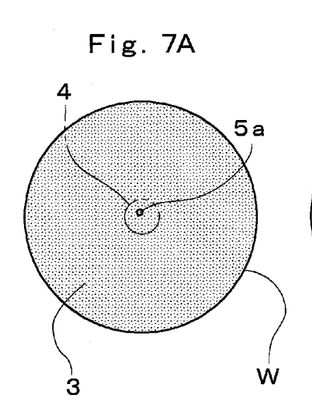
FIGS. 7A-7G are views for explaining the problem incidental to the conventional method of scan rinsing, and are each plan views illustrating a substrate.
Figure 7B:
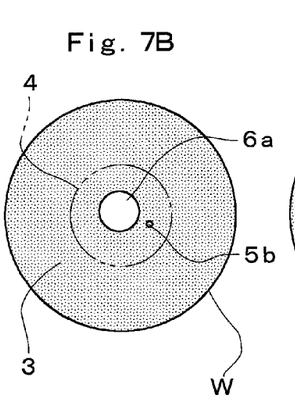
Figure 7C:
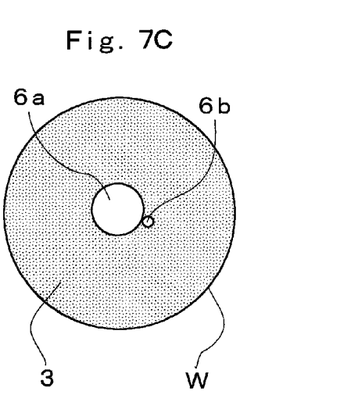

That is, when the discharge nozzle is scanned from the center of the substrate toward the periphery while the cleaning solution is being discharged from the outlet of the cleaning solution discharge nozzle, first the entire surface of the substrate W is covered with a liquid film 3 of the cleaning solution, as illustrated in a plan view of the substrate of FIG. 7A, and subsequently the liquid film 3 in the center portion of the substrate W comes to be thinner to be brought in a state of just before being dried. Then, a portion 4 in the state of just before being dried indicated by a two-dot chain line (hereinafter, referred to as "portion just before being dried"), is spread outward by degrees as illustrated in FIG. 7B, and a dried core 5a is produced in the portion 4 just before being dried. This dried core 5a is enlarged to form a dried region 6a. This dried region 6a is spread all over the surface of the substrate W to dry the substrate W. However, in the case where the resist film surface on the substrate has high water-repellent properties, in the vicinity of the center of the substrate W, a second dried core 5b is produced following the production of the first dried core 5a within the portion 4 just before being dried, and there are some cases where a further new dried core is produced. Moreover, in the prior art, the discharge nozzle is merely moved from the center of the substrate W toward the periphery, so that a comparatively wide portion 4 just before being dried is formed in the vicinity of the center of the substrate W. Therefore, in the vicinity of the center of the substrate W, the second dried core 5b is produced in the portion 4 just before being dried, and sometimes a further new dried core is produced. Incidentally, no dried core is produced other than in the vicinity of the center of the substrate W. Then, as illustrated in FIG. 7C, the dried region 6a having been first formed is enlarged, and the second dried core 5b is enlarged to form a second dried region 6b, and this dried region 6b is enlarged as well.

Figure 7D:
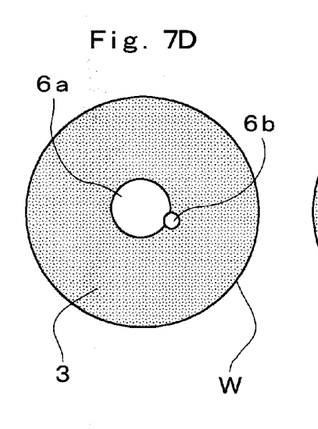
Figure 7E:
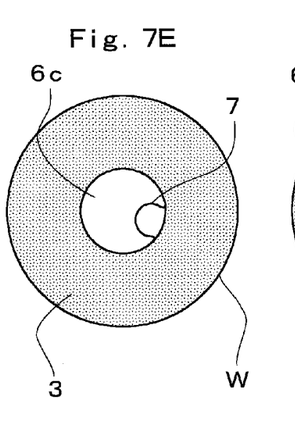
Figure 7F:
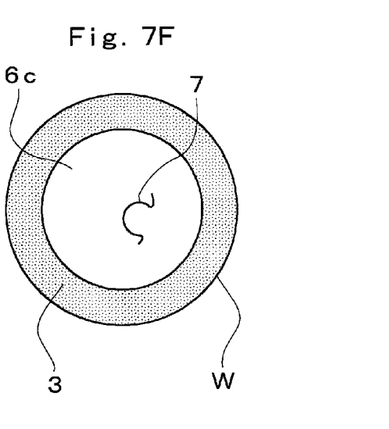
Figure 7G:
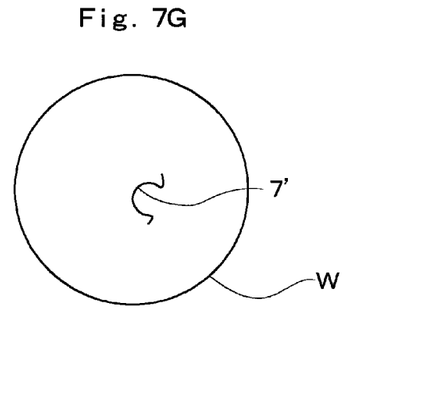

The two dried regions 6a and 6b are enlarged respectively as mentioned above, and the two dried regions 6a and 6b are collided each other to be joined, as illustrated in FIG. 7D. Then, one dried region 6c is produced as illustrated in FIG. 7E. At this time, a droplet 7 of the cleaning solution is produced at a boundary portion between two dried regions 6a and 6b. Subsequently, although the dried region 6c that is formed by being joined into one is enlarged to the outside as illustrated in FIG. 7F, the droplet 7 of the cleaning solution remains as it is to the end. Then, although finally the entire surface of the substrate W will be dried as illustrated in FIG. 7G, the remaining droplet 7 of the cleaning solution will be dried as it is, and a dried mark (stain such as a water mark) 7' of the cleaning solution remains as it is on the substrate W. As a result, a development failure will occur. Incidentally, the phenomenon as mentioned above is not limited to the case of drying by scan rinsing a substrate having been processed, but is found to happen generally in the case of a substrate having a surface of high water-repellent properties.

Additionally, according to the method described in the above-mentioned Japanese Patent No, 3694641, while an air jet nozzle that is disposed spaced apart by a predetermined distance from a cleaning solution (rinse) discharge nozzle is being moved from the center of the substrate to the periphery integrally or in synchronization with the cleaning solution discharge nozzle, a gas is blown out from the air jet nozzle, thereby the cleaning solution remaining on the substrate is dried and removed. By this method, however, the production of not less than two dried cores in the vicinity of the center of the substrate cannot be prevented. Moreover, when two dried cores are produced in the vicinity of the center of the substrate, even if the gas is blown to the substrate from the air jet nozzle, there is such occurrence as respective dried cores are enlarged ant thus the dried regions are spread, and then the two dried regions are collided each other to be joined into one. Consequently, a problem exists in that the production of dried marks of the cleaning solution that will be the cause of the development failure cannot be eliminated.

SUMMARY OF THE INVENTION

The present invention was made in view of the situations mentioned above, and has an object of providing a substrate processing method capable of eliminating the occurrence of, e.g. development failure when with a cleaning solution being discharged from an outlet of a discharge nozzle to a surface of a substrate, the outlet thereof is scanned from a center of the substrate to a circumferential edge, to dry the substrate by spinning. The invention also provides a substrate processing apparatus by which the substrate processing method can be preferably carried out.

The invention according to one aspect is a substrate processing method in which a substrate is held in a horizontal posture and rotated about a vertical axis, and while a cleaning solution is being discharged to a surface of the substrate from an outlet of a discharge nozzle, the outlet of the mentioned discharge nozzle is scanned from a position opposed to a center of the substrate to a position opposed to a circumferential edge of the substrate, to dry the substrate; and in which only one dried core, which will be a starting point when a dried region is formed, is produced on the substrate being in a state that the surface thereof is covered with the cleaning solution, and then the dried region letting this dried core be a starting point is spread all over the surface of the substrate, to dry the substrate.

According to this substrate processing method, one dried region, letting only one dried core produced in the vicinity of the center of the substrate be a starting point, is spread all over the substrate to dry the substrate, and there is no production of not less than two dried cores in the vicinity of the center of the substrate. Consequently, there is no occurrence of remaining dried marks of a cleaning solution on the substrate. As a result, the occurrence of, e.g., development failure can be eliminated.

According to another aspect of the invention, the outlet of the mentioned discharge nozzle is started to move from the position opposed to the center of the substrate toward the circumferential edge of the substrate, and in a region inside a circumference letting a center position of the substrate be a center and letting a distance to a position on the substrate surface opposed to the outlet of the mentioned discharge nozzle be a radius, after a first dried core that will be a starting point at the time when a dried region is formed on the substrate has been produced, before a second dried core is produced, a gas is blown out to the center surface of the substrate from a jet hole of a gas jet nozzle.

According to this substrate processing method, after the outlet of the discharge nozzle has started to move from the position opposed to the center of the substrate toward the circumferential edge of the substrate, and after the first dried core has been produced in the vicinity of the center of the substrate, before the second dried core is produced, a gas is blown out to the center surface of the substrate from the jet hole of the gas jet nozzle. Accordingly, before the second dried core is allowed to be produced, one dried region is forced to form rapidly letting the first dried core be a starting point, and this one dried region spreads toward the outside, to dry the entire surface of the substrate. In this manner, one dried region letting one dried core having been produced in the vicinity of the center of the substrate be a starting point spreads all over the surface of the substrate to dry the substrate, and there is no production of not less than two dried cores in the vicinity of the center of the substrate, so that there is no occurrence of remaining dried marks of any cleaning solution on the substrate. These operations are now described in further detail with reference to FIG. 3 illustrating plan views of the substrate.

Figure 3A:
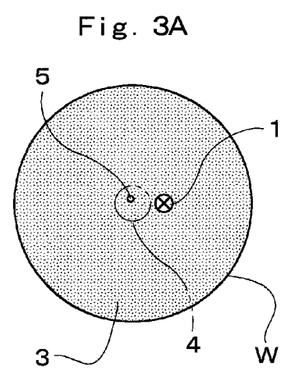
FIGS. 3A-3E are views for explaining operations in the substrate processing method according to the invention, and are plan views each illustrating a substrate.
Figure 3B:
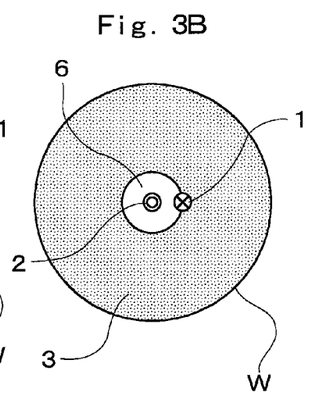
Figure 3C:
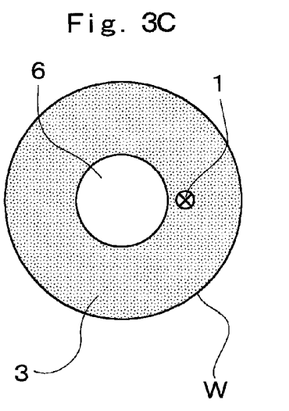
Figure 3D:
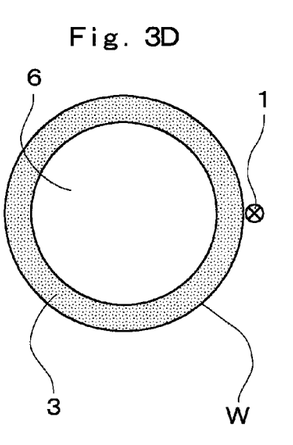
Figure 3E:
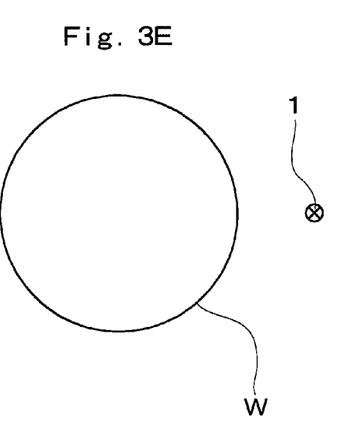

While a cleaning solution is being discharged from the outlet of the cleaning solution discharge nozzle indicated by reference numeral 1, the discharge nozzle 1 is moved from the center of the substrate W to the periphery, and when a short time period has elapsed since the start of the discharge nozzle 1 being moved and the discharge nozzle 1 has moved to a predetermined position, a gas is blown out toward the center surface of the substrate W from the jet hole of the gas jet nozzle 2 as illustrated in FIG. 3B. At this time, although first the entire surface of the substrate W is covered with a liquid film 3 of the cleaning solution, the liquid film 3 in the vicinity of the center of the substrate W comes to be thinner to be in a state of just before being dried, and subsequently, a first dried core 5 is produced in a portion 4 just before being dried indicated by the two-dot chain line, as illustrated in FIG. 3A. Then, at the right time after the first dried core 5 has been produced and before the second dried core is produced, the gas is blown out to the center surface of the substrate W from the jet hole of the gas jet nozzle 2, whereby without production of the second dried core in the vicinity of the center of the substrate W, the first dried core 5 is enlarged to form a dried region 6, as illustrated in FIG. 3B. At this time, on the outside of a circumference letting the center of the substrate W be a center and letting a distance to the position on the substrate surface opposed to the outlet of the discharge nozzle 1 be a radius, since a cleaning solution continues to be discharged from the outlet of the discharge nozzle 1, the liquid film 3 remains as it is. Then, accompanied by the movement of the discharge nozzle 1 toward the circumferential edge of the substrate W, the first dried region 6 spreads outward as illustrated in FIGS. 3C and 3D, and the dried region 6 spreads all over the surface of the substrate W to dry the substrate W as illustrated in FIG. 3E.

According to this substrate processing method, there is no occurrence of such a phenomenon that not less than two dried cores are produced in the vicinity of the center of the substrate and not less than two dried regions are collided each other to be joined, so that there are no dried mark of the cleaning solution remaining on the substrate. As a result, the occurrence of, e.g., development failure can be eliminated.

According to another aspect of the invention, a gas of a large flow rate is instantaneously blown out toward the center surface of the substrate from the jet hole of the mentioned gas jet nozzle.

According to this substrate processing method, due to that a gas of a large flow rate is instantaneously blown out toward the center surface of the substrate from the jet hole of the gas jet nozzle, in the vicinity of the center of the substrate, one dried region is formed at once letting the first dried core be a starting point.

According to another aspect of the invention, a gas of a small flow rate is continuously blown out toward the center surface of the substrate from the jet hole of the mentioned gas jet nozzle.

According to this substrate processing method, due to that a gas of a small flow rate is continuously blown out toward the center surface of the substrate from the jet hole of the gas jet nozzle, in the vicinity of the center of the substrate, one dried region is formed letting the first dried core be a starting point, and this dried region spreads outward.

According to another aspect of the invention, after the outlet of mentioned discharge nozzle has started to move from the position opposed to the center of the substrate toward the circumferential edge of the substrate, before drying is started at the center portion of the substrate, the outlet of the mentioned discharge nozzle is once stopped, and after drying has started in a small region inside a circumference letting a center position of the substrate be a center and letting a distance to a position on the substrate surface opposed to the outlet of the mentioned discharge nozzle be a radius, the outlet of the mentioned discharge nozzle is moved again toward the circumferential edge of the substrate.

According to this substrate processing method, after the outlet of the discharge nozzle has started to move from the position opposed to the center of the substrate toward the circumferential edge of the substrate, the outlet of the discharge nozzle is once stopped. By this operation, the area of the portion just before being dried in the vicinity of the center of the substrate is controlled, and thus the production of not less than two dried cores in the vicinity of the center of the substrate can be prevented. Then, the first core is produced in the vicinity of the center of the substrate, this dried core is enlarged, and then after drying has started in a small region letting the center position of the substrate be a center and letting a distance to the position on the substrate surface opposed to the outlet of the discharge nozzle be a radius, the outlet of the discharge nozzle is moved again toward the circumferential edge of the substrate. As a result, one dried region spreads outward, and the entire surface of the substrate is dried. In this manner, only one dried core is produced in the vicinity of the center of the substrate, and thus one dried region letting this dried core be a starting point spreads all over the surface of the substrate, so that there is no occurrence of such a phenomenon that dried marks of a cleaning solution remain on the substrate. These operations are described in further detail with reference to FIG. 6 illustrating plan views of the substrate.

Figure 6A:
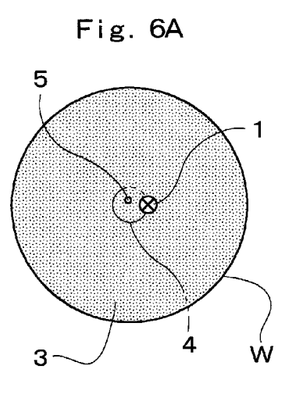
FIGS. 6A-6E are views for explaining operations in the substrate processing method according to this invention, and are plan views each illustrating a substrate.
Figure 6B:
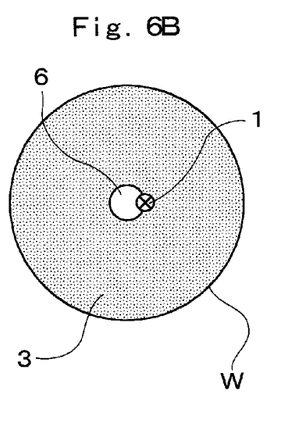

While the cleaning solution is being discharged from the outlet of the cleaning solution discharge nozzle indicated by reference numeral 1, the discharge nozzle 1 is moved from the center of the substrate W toward the periphery, and when the discharge nozzle 1 has moved to a predetermined position, the discharge nozzle 1 is once stopped while continuing to discharge the cleaning solution from the outlet. At this time, although first the entire surface of the substrate W is covered with the liquid film 3 as illustrated in FIG. 6A, the liquid film 3 comes to be thinner in a small region letting the center position of the substrate be a center and letting a distance to the position on the substrate surface opposed to the outlet of the discharge nozzle 1 be a radius, to come into a state of just before being dried. Subsequently, one dried core 5 is produced in a portion 4 just before being dried indicated by the two-dot chain line, and the dried core 5 is enlarged to form a dried region 6 as illustrated in FIG. 6B. At this time, on the outside of the mentioned circumference, since the cleaning solution continues to be discharged from the outlet of the discharge nozzle 1, the liquid film 3 remains as it is. Then, by controlling the area of the portion 4 just before being dried inside of the mentioned circumference with a stop position of the discharge nozzle 1, the production of not less than two dried cores in the vicinity of the center of the substrate W is prevented.

Figure 6C:
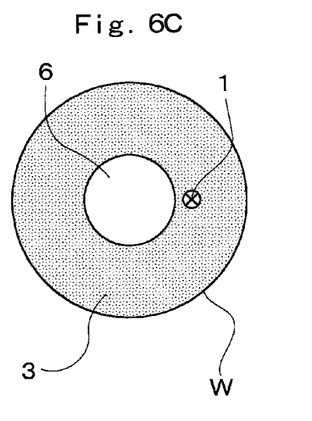
Figure 6D:
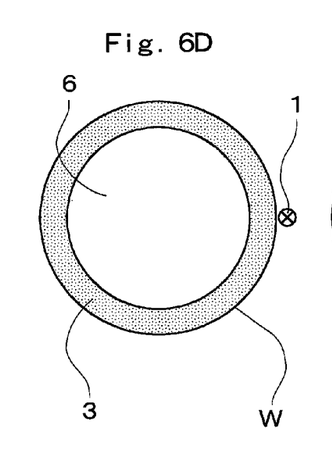
Figure 6E:
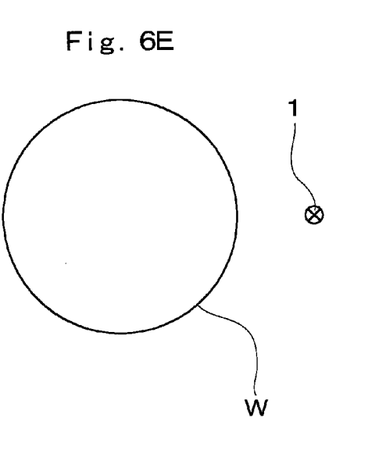

When drying of the substrate W is started in the small region inside the mentioned circumference, the discharge nozzle 1 is moved again toward the circumferential edge of the substrate W. Thus, one dried region 6 spreads outward as illustrated in FIGS. 6C and 6D, and the dried region 6 spreads all over the surface of the substrate W to dry the substrate W as illustrated in FIG. 6E.

According to this substrate processing method, there is no occurrence of such a phenomenon that not less than two dried cores are produced in the vicinity of the center of the substrate and not less than two dried regions are collided each other to be joined, so that there is no occurrence of remaining dried marks of the cleaning solution on the substrate. As a result, the occurrence of, e.g., development failure can be eliminated.

According to another aspect of the invention, after the outlet of mentioned discharge nozzle has started to move from the position opposed to the center of the substrate toward the circumferential edge of the substrate, a drying gas is blown out to the center surface of the substrate from the jet hole of the gas jet nozzle.

According to this substrate processing method, due to that after the outlet of the discharge nozzle has started to move from the position opposed to the center of the substrate toward the circumferential edge of the substrate, a drying gas is blown out to the center surface of the substrate from the jet hole of the gas jet nozzle, drying is rapidly started in a small region letting the center position of the substrate be a center and letting a distance to the position on the substrate surface opposed to the outlet of the discharge nozzle having been once stopped be a radius, thus enabling to shorten a time period of once stopping the discharge nozzle. As a result, a throughput can be improved.

The invention according to a further aspect is a substrate processing apparatus comprising: substrate holding means holding a substrate in a horizontal posture; substrate rotating means rotating the substrate held by the mentioned substrate holding means about a vertical axis; a discharge nozzle discharging a cleaning solution from an outlet to a surface of the substrate that is held by the mentioned substrate holding means and rotated by the mentioned substrate rotating means; cleaning solution feeding means feeding the cleaning solution to this discharge nozzle; and nozzle moving means scanning the outlet of the mentioned discharge nozzle from a position opposed to a center of the substrate to a position opposed to a circumferential edge of the substrate while the cleaning solution is being discharged onto the surface of the substrate from the mentioned outlet. This substrate processing apparatus further comprises: a gas jet nozzle blowing out a gas toward a center surface of the substrate from a jet hole thereof in a state that the jet hole is stopped at a position opposed to the center of the substrate; gas feeding means feeding a gas to the mentioned gas jet nozzle; and control means controlling the mentioned gas feeding means such that immediately after the outlet of the mentioned discharge nozzle has started to move from the position opposed to the center of the substrate toward the circumferential edge of the substrate, the gas is blown out toward the center surface of the substrate from the jet hole of the mentioned gas jet nozzle.

In this substrate processing apparatus, the gas feeding means is controlled by the control means, and immediately after the outlet of the discharge nozzle has started to move from the position opposed to the center of the substrate toward the circumferential edge of the substrate, the gas is blown out to the center surface of the substrate from the jet hole of the gas jet nozzle. Accordingly, before the second dried core is allowed to be produced, one dried region is forced to form rapidly letting the first dried core be a starting point, and this one dried region spreads toward to the outside, to dry the entire surface of the substrate. In this manner, one dried region letting only one dried core having been produced in the vicinity of the center of the substrate be a starting point spreads all over the surface of the substrate to dry the substrate, and there is no production of not less than two dried cores in the vicinity of the center of the substrate, so that there is no occurrence of remaining dried marks of a cleaning solution on the substrate. As a result, when using this substrate processing apparatus, the substrate processing method as described above is preferably carried out, thus enabling to provide the above-mentioned advantages.

According to another aspect of the invention, the mentioned control means controls the mentioned gas feeding means such that a gas of a large flow rate is instantaneously blown out toward the center surface of the substrate from the jet hole of mentioned gas jet nozzle.

In this substrate processing apparatus, the gas feeding means is controlled by control means, and thus the gas of a large flow rate is instantaneously blown out toward the center surface of the substrate from the jet hole of the gas jet nozzle. Accordingly, in the vicinity of the center of the substrate, one dried region is formed at once letting the first dried core be a starting point. As a result, when using this substrate processing apparatus, the substrate processing method as described above is preferably carried out, thus enabling to provide the above-mentioned advantages.

According to another aspect of the invention, the mentioned control means controls the mentioned gas feeding means such that a gas of a small flow rate is continuously blown out toward the center surface of the substrate.

In this substrate processing apparatus, the gas feeding means is controlled by control means, and thus the gas of a small flow rate is continuously blown out toward the center surface of the substrate from the jet hole of the gas jet nozzle. Accordingly, in the vicinity of the center of the substrate, one dried region is formed letting the first dried core be a starting point, and thus this dried region spreads outward. As a result, when using this substrate processing apparatus, the substrate processing method is preferably carried out as described above, thus enabling to provide the above-mentioned advantages.

The invention according to yet another aspect is a substrate processing apparatus comprising: substrate holding means holding a substrate in a horizontal posture; substrate rotating means rotating the substrate held by the mentioned substrate holding means about a vertical axis; a discharge nozzle discharging a cleaning solution from an outlet to a surface of the substrate that is held by the mentioned substrate holding means and rotated by the mentioned substrate rotating means; cleaning solution feeding means feeding the cleaning solution to the mentioned discharge nozzle; and nozzle moving means scanning the outlet of the mentioned discharge nozzle from a position opposed to a center of the substrate to a position opposed to a circumferential edge of the substrate while the cleaning solution is being discharged onto the surface of the substrate from the mentioned outlet. This substrate processing apparatus further comprises: control means controlling the mentioned nozzle moving means such that after the outlet of the mentioned discharge nozzle has started to move from a position opposed to a center of the substrate toward a circumferential edge of the substrate, before drying at the center portion of the substrate is started, the outlet of the mentioned discharge nozzle is once stopped, and after drying has started in a small region letting a center position of the substrate be a center and letting a distance to a position on the substrate surface opposed to the outlet of mentioned discharge nozzle be a radius, the outlet of the mentioned discharge nozzle is moved again toward the circumferential edge of the substrate.

In this substrate processing apparatus, the nozzle moving means is controlled by control means, and after the outlet of the discharge nozzle has started to move from the position opposed to the center of the substrate toward the circumferential edge of the substrate, the outlet of the discharge nozzle is once stopped. By this operation, the area of the portion just before being dried in the vicinity of the center of the substrate is controlled, and thus the production of not less than two dried cores in the vicinity of the center of the substrate can be prevented. Furthermore, one dried core is produced in the vicinity of the center of the substrate, this dried core is enlarged, and after drying has started in a small region letting the center position of the substrate be a center and letting a distance to the position on the substrate surface opposed to the outlet of the discharge nozzle be a radius, the nozzle moving means is controlled by control means, and then the outlet of the discharge nozzle is made to move again toward the circumferential edge of the substrate. Accordingly, one dried region spreads outward, and the entire surface of the substrate is dried. In this manner, only one dried core is produced in the vicinity of the center of the substrate, and one dried region with this dried core a starting point spreads all over the surface of the substrate to dry the substrate, so that there is no occurrence of such a phenomenon that dried marks of the cleaning solution remain on the substrate. As a result, when using this substrate processing apparatus, the substrate processing method as described above is preferably carried out, thus enabling to provide the above-mentioned effects.

According to another aspect of the invention, the substrate processing apparatus further comprises: a gas jet nozzle blowing out a drying gas from a jet hole to the center surface of the substrate that is held by the mentioned substrate holding means and rotated by the mentioned substrate rotating means; and gas feeding means feeding a drying gas to this gas jet nozzle.

In this substrate processing apparatus, after the outlet of the discharge nozzle has started to move from the position opposed to the center of the substrate toward the circumferential edge of the substrate, a drying gas is fed to the gas jet nozzle by gas feeding means, and thus the drying gas is blown out to the center surface from the jet hole of the gas jet nozzle, whereby drying is rapidly started in a small region letting the center position of the substrate be a center and letting a distance to the position on the substrate surface opposed to the outlet of the discharge nozzle be a radius. As a result, when using this substrate processing apparatus, the substrate processing method as described above is preferably carried out, thus enabling to provide the above-mentioned advantages.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Several preferred embodiments according to the present invention are hereinafter described referring to the drawings.

Figure 1:
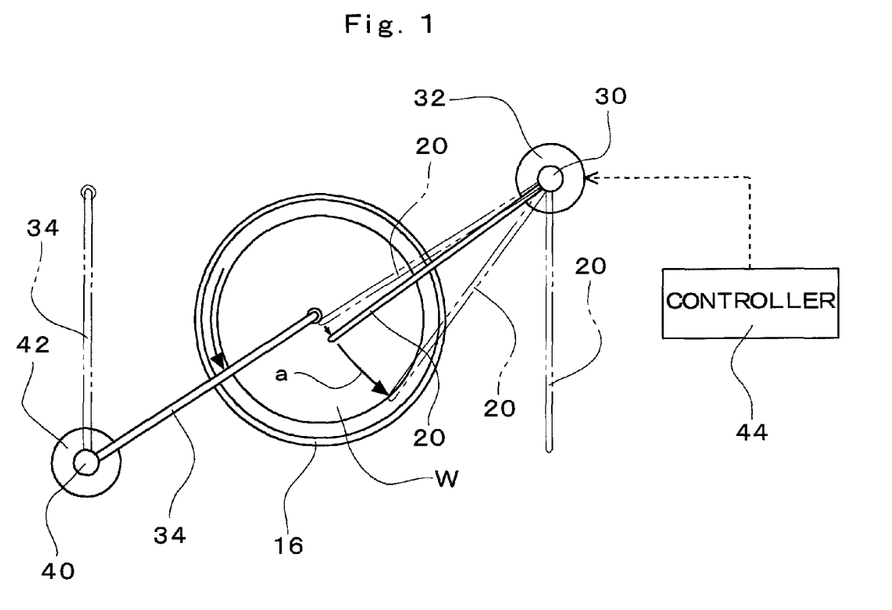
FIG. 1 is a schematic plan view illustrating one example of construction of a substrate processing apparatus used in carrying out a substrate processing method according to the present invention.
Figure 2:
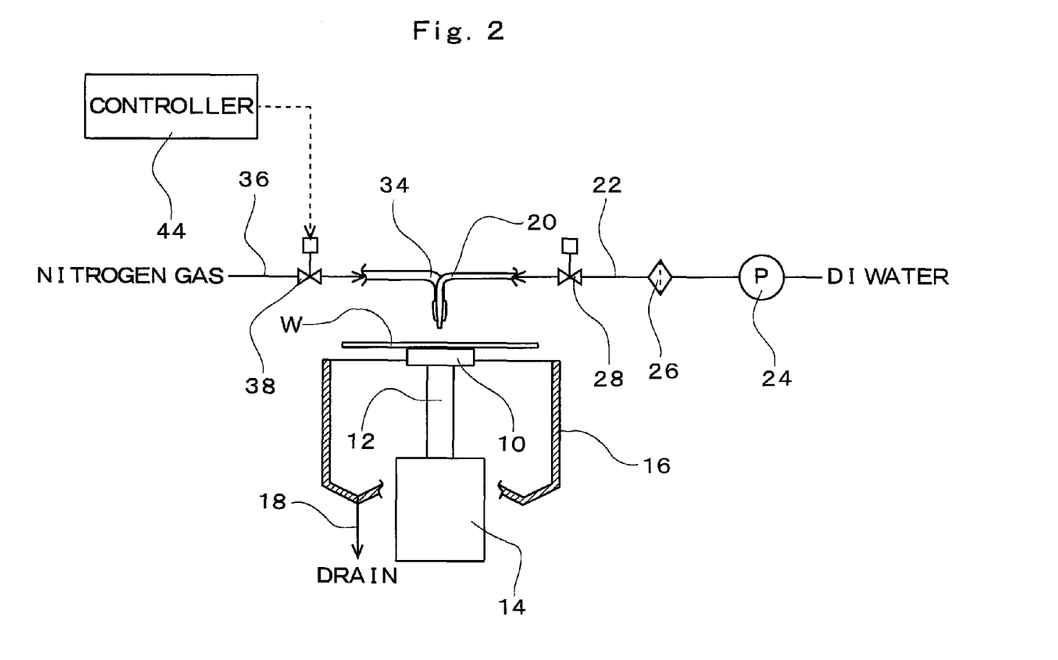
FIG. 2 is a schematic sectional view of the substrate processing apparatus illustrated in FIG. 1.

FIGS. 1 and 2 illustrate one example of construction of a substrate processing apparatus used in carrying out a substrate processing method according to the invention, and in which FIG. 1 is a schematic plan view of the substrate processing apparatus, and FIG. 2 is a schematic sectional view.

In this substrate processing apparatus, cleaning (rinsing) is conducted after a substrate on which surface a resist film having been exposed is formed. The substrate processing apparatus is provided with a spin chuck 10 holding a substrate W in a horizontal posture, a spindle 12 to the upper end of which the spin chuck 10 is fixed and which is vertically supported, and a rotation motor 14 of which rotary shaft is connected to the spindle 12, and which causes the spin chuck 10 and the spindle 12 to rotate about a vertical axis. A cup 16 is disposed around the spin chuck 10 so as to surround the substrate W on the spin chuck 10. The cup 16 is supported in a manner of a reciprocating motion in a vertical direction by a support mechanism, not illustrated, and a drain tube 18 is connected in communication to the bottom of the cup 16. Furthermore, although not illustrated in FIGS. 1 and 2, there is provided a mechanism feeding a developer onto the substrate W, for example, a developer feed mechanism provided with a developer discharge nozzle on the lower end face of which a slit-like outlet is formed, and while a developer is being discharged from this slit-like outlet, the developer discharge nozzle is linearly moved in a horizontal direction orthogonal to the slit-like outlet, to feed and evenly spread the developer onto the substrate W, or a developer feed mechanism provided with a developer discharge nozzle formed of a straight nozzle, this developer discharge nozzle is supported such that an outlet at a tip end is reciprocated between a discharge position of being located right over the center of the substrate W and a stand-by position, and the developer is discharged onto the center of the substrate W from the tip end outlet of the developer discharge nozzle.

Moreover, a DI water discharge nozzle 20 discharging onto the substrate W a cleaning solution (rinse), for example, DI water is disposed in the lateral vicinity of the cup 16. The DI water discharge nozzle 20 is channel-connected to a DI water supply source through a DI water feed tube 22, and a pump 24, a filter 26 and a switching control valve 28 are interposed in the DI water feed tube 22. The DI water discharge nozzle 20 is held by a nozzle holding portion 30 so as to be capable of turning within a horizontal plane, and turned within the horizontal plane by a rotating drive mechanism 32. Furthermore, as illustrated by an arrow a in FIG. 1, the DI water discharge nozzle 20 is constructed so as to be scanned from a position where the outlet is opposed to the center of the substrate W to a position where the substrate W is opposed to a circumferential edge of the substrate W while discharging the DI water from the outlet at the tip end to the surface of the substrate W, and as illustrated in the two-dot chain lines, so as to reciprocate between a stand-by position of being out of place to the outside from the cup 16 and a position where the outlet is located right over the center of the substrate W.

Furthermore, this substrate processing apparatus is provided with a gas jet nozzle 34 blowing out a gas, for example, a nitrogen gas from a jet hole located at a tip end onto the substrate W, on the opposite side of the DI water discharge nozzle 20 with the cup 16 being sandwiched, in the lateral vicinity of the cup 16. The gas jet nozzle 34 is channel-connected to a nitrogen gas supply source through a gas feed tube 36, and a switching control valve 38 is interposed in the gas feed tube 36. The gas jet nozzle 34 is held by a nozzle holding portion so as to be capable of turning within the horizontal plane, and turned within the horizontal plane by a rotating drive mechanism 42. Further, the gas jet nozzle 34 is constructed so as to reciprocate between a stand-by position being out of place to the outside from the cup 26 as illustrated in the two-dot chain line in FIG. 1, and a position where the jet hole is located right over the center of the substrate W as indicated by the solid line.

The switching control vale 38 interposed in the gas feed tube 36 is connected to a controller 44. By this controller 44, the operation of blowout and stop of the nitrogen gas from the jet hole of the gas jet nozzle 34 is controlled. That is, a switching operation of the switching control valve 38 is controlled by the controller 44 such that immediately after the DI water discharge nozzle 20 has just started to move from the center of the substrate W to the periphery, and at the time point when the outlet of the DI water discharge nozzle 20 moves a small distance from a position opposed to the center of the substrate W to have reached a predetermined position (position indicated by the solid line in FIG. 1), the nitrogen gas is blown out from the jet hole of the gas jet nozzle 34 to the center surface, and thereafter this blowout is stopped. More specifically, it is controlled such that the DI water discharge nozzle 20 is started to move, and after a first dried core is produced in a region inside of a circumference letting a center position of the substrate W be a center and letting a distance therefrom to a position on the substrate opposed to the outlet of the DI water discharge nozzle 20 be a radius, before a second dried core is produced, the nitrogen gas is blown out from the jet hole of the gas jet nozzle 34. At the time of the blowout of the nitrogen gas to the center surface of the substrate W, the nitrogen gas of a large flow rate may be instantaneously blown out from the jet hole of the gas jet nozzle 34, or the nitrogen gas of a small flow rate may be continuously blown out.

Using the substrate processing apparatus illustrated in FIGS. 1 and 2, after a developer is fed onto a resist film having been exposed formed on the surface of the substrate W to process the resist film, a DI water is fed onto the substrate W while the substrate is being rotated at a comparatively low speed, to make cleaning so that the developer is washed out and removed from on the resist film on the surface of the substrate W, and thereafter the substrate W is rotated at a comparatively high speed to make a spin-drying (scan rinsing). At the time of scan rinsing, the substrate W that is held on the spin chuck 10 is rotated at a comparatively high speed by the rotation motor 14, and while the DI water is being discharged from the outlet of the DI water discharge nozzle 20 onto the substrate W, the DI water discharge nozzle 20 is scanned, and in this process, a nitrogen gas is blown out from the jet hole of the gas jet nozzle 34 toward the center surface of the substrate W.

Showing specifically one example with numerical values, a substrate W of a diameter of 200 mm to 300 mm is rotated at a rotation speed of 1800 rpm to 2100 rpm, thereby the DI water discharge nozzle 20 is moved to a position where an outlet thereof is opposed to the center of the substrate W, and then the DI water discharge nozzle 20 is moved at a scan speed of 6 mm to 10 mm toward the periphery of the substrate W, while the DI water is being discharged at a flow rate of 0.4 l/min to 0.6 l/min from the outlet of the DI water discharge nozzle 20 onto the substrate W. Then, after several seconds have elapsed, for example, two seconds have elapsed from the time point at which the DI water discharge nozzle 20 has started to move, that is, when the outlet of the DI water discharge nozzle 20 is moved to a position by a distance of 12 mm to 20 mm from the center of the substrate W, as illustrated with a solid line in FIG. 1, a nitrogen gas is fed through the gas feed tube 36 from a nitrogen supply source to the gas jet nozzle 34 of which jet hole is located right over the center of the substrate W, and the nitrogen gas is blown out from the jet hole of the gas jet nozzle 34 to the center surface of the substrate W. This blowout of the nitrogen gas is conducted, for example, for about one second at a flow rate of about 10 l/min. Alternatively, the blowout of the nitrogen gas may be conducted, for example, for several seconds at a flow rate of about 0.1 l/min. Although the blowout of the nitrogen gas from the jet hole of the gas jet nozzle 34 is stopped shortly after a dried region has been formed at the central portion of the substrate W, the nitrogen gas may be blown out from the jet hole of the gas jet nozzle 34 for a while.

The timing of blowout of a nitrogen gas toward the center surface of the substrate W has preliminarily been determined by making tests on the various conditions including type, kind, size or surface state of the substrate W, rotation speed of the substrate W, discharge flow rate of DI water from the outlet of the DI water discharge nozzle 20, scan speed of the DI water discharge nozzle 20 and the like, and observing whether or not the second dried core is produced after the first dried core has been produced in the vicinity of the center of the substrate W.

The DI water discharge nozzle 20 is continuously scanned even when the nitrogen gas is blown out from the jet hole of the gas jet nozzle 34. Then, the outlet of the DI water discharge nozzle 20 is scanned up to a position opposed to the circumferential edge of the substrate W. When the outlet of the DI water discharge nozzle 20 has reached the position opposed to the circumferential edge of the substrate W, the switching control valve 28 that is interposed in the DI water feed tube 22 is closed to stop the feed of the DI water to the DI water discharge nozzle 20, thus the discharge of the DI water from the DI water discharge nozzle 20 is stopped, and the DI water discharge nozzle 20 is moved to the stand-by position. Then, when drying of the substrate W is ended, the rotation of the substrate W is stopped.

It is preferable that the timing of blowing out a nitrogen gas from the jet hole of the gas jet nozzle 34 or stopping the blowout is controlled by a microcomputer on the basis of an operating program. Alternatively, it is preferable that the position of the DI water discharge nozzle 20 is detected by an encoder, and with this detection signal, at the time point when the DI water discharge nozzle has reached a predetermined position, the nitrogen gas is blown out from the jet hole of the gas jet nozzle 34. As an alternative, it is preferable that using a timer, at the time point when a predetermined time period has elapsed from the time point of starting to scan the DI water discharge nozzle 20, the nitrogen gas is blown out from the jet hole of the gas jet nozzle 34, and at the time point when a predetermined time period has elapsed from this blowout time point, the blowout of the nitrogen gas is stopped.

Incidentally, it is preferable that in the process of scanning the outlet of the DI water discharge nozzle 20 to the position opposed to the circumferential edge of the substrate W, the rotation speed of the substrate W is decreased. Specifically, such a control is made by the controller (not illustrated) so that at the time point when the outlet of the DI water discharge nozzle 20 is moved a predetermined distance, for example, at the time point when it has reached a radius position of 60 mm from the center of the substrate W, the rotation speed of the substrate W is decreased, for example, from the number of revolutions of 1800 rpm through 1200 rpm, to the number of revolutions of 1000 rpm through 1200 rpm. The number of times of changing the rotation speed of the substrate W is not limited to once, and the rotation speed of the substrate W is decreased stepwise. As an alternative, it is preferable to be controlled such that as the outlet of the DI water discharge nozzle 20 comes close to the position opposed to the circumferential edge of the substrate W, the rotation speed of the substrate W is decreased by degrees, for example, linearly decreased.

When conducting the scan rinsing by the above-mentioned method, the production of not less than two dried cores in the vicinity of the center of the substrate W can be prevented. Then, one dried region letting only one dried core produced in the vicinity of the center of the substrate W be a starting point spreads all over the substrate W to dry the substrate W, so that there is no occurrence of remaining dried marks of the DI water. Thus, by the above-mentioned method, the occurrence of, e.g., development failure can be eliminated.

Figure 4:
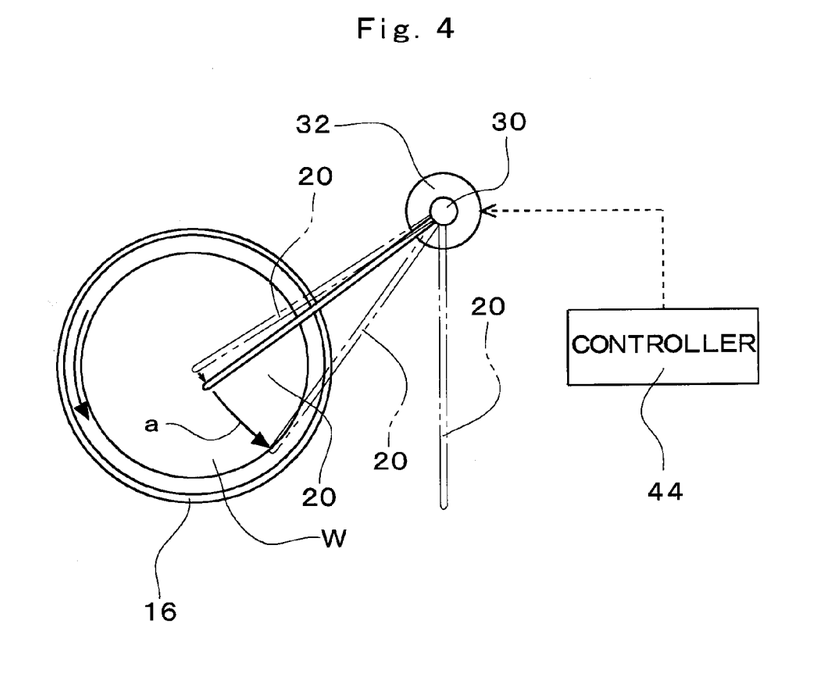
FIG. 4 is a schematic plan view illustrating another example of construction of a substrate processing apparatus used in carrying out a substrate processing method according to the invention.
Figure 5:
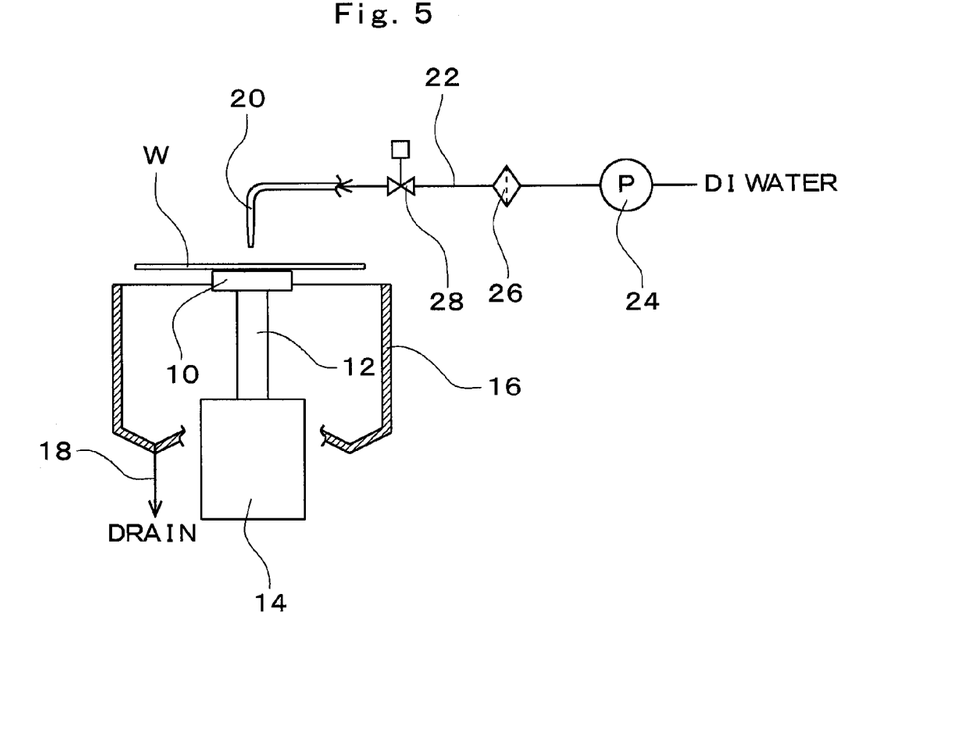
FIG. 5 is a schematic sectional view of the substrate processing apparatus illustrated in FIG. 4.

FIGS. 4 and 5 illustrate another construction example of a substrate processing apparatus used in carrying out the substrate processing method according to this invention, and in which FIG. 4 is a schematic plan view of the substrate processing apparatus, and FIG. 5 is a schematic sectional view thereof. In FIGS. 4 and 5, each member designated with the same reference numerals as in FIGS. 1 and 2 has the same function and action as those of the above-mentioned member described in FIGS. 1 and 2, and further descriptions thereof are omitted.

This substrate processing apparatus has a construction of controlling the rotating drive mechanism 32 with the controller 44 to control the operation of moving and stopping the DI water discharge nozzle 20. That is, by the controller 44, the rotating drive mechanism 32 is controlled such that in the process that the outlet of the DI water discharge nozzle 20 is scanned from the position of being opposed to the center of the substrate W to the position of being opposed to the circumferential edge of the substrate W as indicated by the arrow a, after the outlet of the DI water discharge nozzle 20 has started to move from the position of being opposed to the center of the substrate W (position indicated by the two-dot chain line in FIG. 4), the DI water discharge nozzle 20 is once stopped at the time point when the outlet of the DI water discharge nozzle 20 has moved to a predetermined position (position indicated by a solid line in FIG. 4), and thereafter the outlet of the DI water discharge nozzle 20 is moved toward the circumferential edge of the substrate W.

Using the substrate processing apparatus illustrated in FIGS. 4 and 5, after a developer is fed onto a resist film having been exposed formed on the surface of the substrate W to process the resist film, a DI water is fed onto the substrate W while the substrate is being rotated at a comparatively low speed, to make cleaning so that the developer is washed out and removed from on the resist film on the surface of the substrate W, and thereafter the substrate W is rotated at a comparatively high speed to make a spin-drying (scan rinsing). At the time of scan rinsing, the substrate W that is held on the spin chuck 10 is rotated at a comparatively high speed by the rotation motor 14, and while the DI water is being discharged from the outlet of the DI water discharge nozzle 20 onto the substrate W, the DI water discharge nozzle 20 is scanned as follows.

Showing specifically one example with numerical values, a substrate W of a diameter of 200 mm to 300 mm is rotated at a rotation speed of 1800 rpm to 2100 rpm, thereby the DI water discharge nozzle 20 is moved to a position where an outlet thereof is opposed to the center of the substrate W, and then the DI water discharge nozzle 20 is moved at a scan speed of 6 mm to 10 mm toward the periphery of the substrate W, while the DI water is being discharged at a flow rate of 0.41/min to 0.61/min from the outlet of the DI water discharge nozzle 20 onto the substrate W. Then, when the outlet of the DI water discharge nozzle 20 has moved up to the position of a distance of 20 mm to 25 mm from the center of the substrate, the DI water discharge nozzle 20 is once stopped. This DI water discharge nozzle 20 is once stopped at the right time after the outlet of DI water discharge nozzle 20 has started to move from the position of being opposed to the center of the substrate W and before the center portion of the substrate W starts to be dried. Furthermore, the position of the DI water discharge nozzle 20 being once stopped is set on the condition that supposing a circumference letting the center position of the substrate W be a center and letting a distance therefrom to the position on the substrate surface opposed to the outlet of the DI water discharge nozzle 20 having been once stopped be a radius, there is only one dried core, being a starting point of drying in a small region inside this circumference. This timing and the position of the DI water discharge nozzle 20 being once stopped has preliminarily been determined by making tests on the various conditions including type, kind, size or surface state of the substrate W, rotation speed of the substrate W, discharge flow rate of DI water from the outlet of the DI water discharge nozzle 20, scan speed of the DI water discharge nozzle 20 and the like, and observing whether or not the second dried core is produced after the first dried core has been produced in the vicinity of the center of the substrate W.

After a predetermine time period, for example, a time period of about 10 seconds has elapsed since the DI water discharge nozzle 20 being once stopped, the DI water discharge nozzle 20 is moved again toward the periphery of the substrate W. The timing of starting to move the DI water discharge nozzle 20 again is to be on and after drying has started in a small region inside the circumference letting the center position of the substrate W be a center and letting a distance therefrom to the position on the substrate surface opposed to the outlet of the DI water discharge nozzle 20 having been once stopped be a radius. Then, the outlet of the DI water discharge nozzle 20 is scanned up to the position opposed to the circumferential edge of the substrate W, and when the outlet of the DI water discharge nozzle 20 has reached the position opposed to the circumferential edge of the substrate W, the switching control valve 28 that is interposed in the DI water feed tube 22 is closed to stop the feed of the DI water to the DI water discharge nozzle 20. The discharge of the DI water from the DI water discharge nozzle 20 is stopped, and the DI water discharge nozzle 20 is moved to the stand-by position. When drying of the substrate W is ended, the rotation of the substrate W is stopped.

It is preferable that the timing of once stopping or starting to move again the DI water discharge nozzle 20 is controlled by a microcomputer on the basis of an operating program. Alternatively, it is preferable that the position of the DI water discharge nozzle 20 is detected by an encoder, and with this detection signal, the DI water discharge nozzle 20 is once stopped or started to move again. As an alternative, it is preferable that using a timer, the DI water discharge nozzle 20 is once stopped at the time point when a predetermined time period has elapsed from the time point of starting to scan the DI water discharge nozzle 20, and the DI water discharge nozzle 20 is moved again toward the periphery of the substrate W at the time point when a predetermined time period has elapsed from the stop time point thereof.

Incidentally, it is preferable that in the process of moving again the DI water discharge nozzle 20 to scan the outlet of the DI water discharge nozzle 20 up to the position opposed to the circumferential edge of the substrate W, the rotation speed of the substrate S is decreased. Specifically, such a control is made by the controller (not illustrated) that at the time point when the outlet of the DI water discharge nozzle 20 is moved a predetermined distance, for example, at the time point of having reached a radius position of 60 mm from the center of the substrate W, the rotation speed of the substrate W is decreased, for example, from the number of revolutions of 1800 rpm to 2100 rpm, to the number of revolutions of 1000 rpm to 1200 rpm. It is preferable that the time of numbers of changing the rotation speed of the substrate W is not limited to once, but the rotation speed of the substrate W is decreased stepwise. As an alternative, it is preferable that as the outlet of the DI water discharge nozzle 20 comes close to the position opposed to the circumferential edge of the substrate W, the rotation speed of the substrate W is decreased by degrees, for example, linearly decreased.

At the time of scan rinsing using the above-mentioned method, by properly setting the position where the DI water discharge nozzle 20 is once stopped, the area of the portion in a state of just before being dried in the vicinity of the center of the substrate W is controlled, and thus the production of not less than two dried cores in the vicinity of the center of the substrate W can be prevented. Then, one dried region letting only one dried core produced in the vicinity of the center of the substrate W be a starting point spreads all over the substrate W to dry the substrate W, so that there is no occurrence of remaining dried marks of the DI water. Consequently, by the above-mentioned method, the occurrence of, e.g., development failure can be eliminated.

Now, another embodiment of the method of scan rinsing using the substrate processing apparatus illustrated in FIGS. 1 and 2 is described.

As described above, after the outlet of the DI water discharge nozzle 20 has started to move from the position opposed to the center of the substrate W toward the circumferential edge of a substrate W, as indicated by the solid line in FIG. 1, a nitrogen gas is fed through the gas feed tube 38 from a nitrogen supply source to the gas jet nozzle 34 of which jet hole is located right over the center of the substrate W, and the nitrogen gas is blown out to the center surface of the substrate W from the jet hole of the gas jet nozzle 34. Thus, drying is rapidly started in a small region inside the circumference letting the center position of the substrate W be a center and letting a distance therefrom to the position on the substrate surface opposed to the outlet of the DI water discharge nozzle 20 having been once stopped be a radius. Then, in the same manner as in the case of scan rinsing with the use of the substrate processing apparatus illustrated in FIGS. 4 and 5, the rotating drive mechanism 32 is controlled by the controller 44. As indicated by the arrow a, in the process that the outlet of the DI water discharge nozzle 20 is scanned from the position opposed to the center of the substrate W to the position opposed to the circumferential edge of the substrate W, after the outlet of the DI water discharge nozzle 20 has started to move from the position opposed to the center of the substrate W (position indicated by a chain two-dashed line in FIG. 1), the DI water discharge nozzle 20 is once stopped at the time point when the outlet of the DI water discharge nozzle 20 is moved to a predetermined position (position indicated by the solid line in FIG. 1), and thereafter the outlet of the DI water discharge nozzle 20 is moved toward the circumferential edge of the substrate W.

In this manner, when a nitrogen gas is blown out to the center surface of the substrate W from the jet hole of the gas jet nozzle 34, drying is rapidly started in a small region inside the circumference letting the center position of the substrate W be a center and letting a distance therefrom to the position on the substrate surface opposed to the outlet of the DI water discharge nozzle 20 having been once stopped be a radius, so that a time period when the DI water discharge nozzle 20 is once stopped can be made shorter, resulting in improvement in throughput. Although the blowout of a nitrogen gas from the jet hole of the gas jet nozzle 34 may be stopped immediately after drying at the center portion of the substrate W has started, the nitrogen gas may be blown out from the jet hole of the gas jet nozzle 34 for a while.

Additionally, in the foregoing description about each of the embodiments, the invention is applied to the processing of scan rinsing of a substrate after a resist film having been exposed and formed on the substrate has been processed. The invention, however, is not limited to the case of drying the substrate having been processed by scan rinsing, but can be widely applicable to the case of scan rinsing of a substrate having a highly water-repellent surface, for example, the case of cleaning (scrubber processing) with a cleaning solution the surface of the substrate or the case of cleaning and drying the substrate having been immersed and exposed.

What is claimed is:

1. A substrate processing method in which a substrate is held in a horizontal posture and rotated about a vertical axis, and while a cleaning solution is being continuously discharged to a surface of the substrate from an outlet of a discharge nozzle, the outlet of said discharge nozzle is scanned from a position opposed to a center of the substrate to a position opposed to a circumferential edge of the substrate, so as to allow a dried region to form at the center of the substrate;

wherein after the outlet of said discharge nozzle has started to move from the position opposed to the center of the substrate toward the circumferential edge of the substrate, and before drying at the center of the substrate is started, the movement of the outlet of said discharge nozzle is once stopped, and after drying has started, by a centrifugal force causing the cleaning solution, which the surface of the substrate is covered with, to flow in a region inside a circumference defined by the center of the substrate as the center and by a distance to a position on the substrate surface opposed to the outlet of said discharge nozzle as the radius, the outlet of said discharge nozzle is moved again toward the circumferential edge of the substrate, whereby only one dried core, which will be a starting point when the dried region is formed on the substrate, is produced, and then the dried region of which said dried core is the starting point is spread all over the surface of the substrate, to dry the substrate; and during the process of scanning the outlet of the discharge nozzle to the position opposed to the circumferential edge of the substrate, the rotation speed of the substrate is decreased.

2. The substrate processing method according to claim 1, wherein after the outlet of said discharge nozzle has started to move from the position opposed to the center of the substrate toward the circumferential edge of the substrate, a drying gas is blown out to the center surface of the substrate from a jet hole of a gas jet nozzle.

3. The substrate processing method according to claim 1, wherein at a time when the outlet of the discharge nozzle has moved a predetermined distance from the position opposed to the center of the substrate, the rotation speed of the substrate is decreased.

4. The substrate processing method according to claim 3, wherein at the time point when the outlet of the discharge nozzle is moved 60 mm from the position opposed to the center of the substrate, the rotation speed of the substrate is decreased.

5. The substrate processing method according to claim 1, wherein the rotation speed of the substrate is decreased from a range of 1800 rpm through 2100 rpm, to a range of 1000 rpm through 1200 rpm.

6. The substrate processing method according to claim 1, wherein the rotation speed of the substrate is decreased stepwise.

7. The substrate processing method according to claim 1, wherein as the outlet of the discharge nozzle comes close to the position opposite to the circumferential edge of the substrate, the rotation speed of the substrate is decreased gradually.

8. The substrate processing method according to claim 1, wherein the rotation speed of the substrate is reduced linearly.

* * * * *